United States Patent [19]

Masuoka

[11] 3,868,187

[45] Feb. 25, 1975

[54] AVALANCHE INJECTION TYPE MOS MEMORY

[75] Inventor: Fujio Masuoka, Ebina, Japan

[73] Assignee: Tokyo Shibaura Electric Co., Ltd., Kawasaki-shi, Japan

[22] Filed: Aug. 31, 1972

[21] Appl. No.: 285,225

[52] U.S. Cl. ........................ 357/23, 357/89, 357/41, 357/13

[51] Int. Cl. ............................................ H01l 11/14

[58] Field of Search ....... 317/235 B, 235 G; 357/23, 357/13, 89, 41

[56] References Cited

UNITED STATES PATENTS

| | | | |
|---|---|---|---|
| 3,470,390 | 9/1969 | Lin | 317/235 |
| 3,555,374 | 1/1971 | Usuda | 317/235 |
| 3,604,990 | 9/1971 | Sigsbee | 317/235 |
| 3,615,938 | 10/1971 | Tsai | 317/235 |
| 3,728,695 | 4/1973 | Frohman-Bentchkowsky | 317/235 |
| 3,755,721 | 8/1973 | Frohman-Bentchkowsky | 317/235 |

OTHER PUBLICATIONS

Physics of Semiconductor Devices, by Sze, page 115, 1969.

IBM Tech. Discl. Bul., "Floating Avalanche-Injection Metal-Oxide Semiconductor Device with Low-Write Voltage," by Torman, page 3721, May 1972.

*Primary Examiner*—Martin H. Edlow
*Attorney, Agent, or Firm*—Flynn & Frishauf

[57] ABSTRACT

Avalanche injection type MOS memory having a floating gate surrounded by an insulating layer between the source and drain regions formed on one side of a semiconductor substrate wherein there is formed one or two auxiliary semiconductor regions with the same type of conductivity as, but with higher concentrations of impurities than, said semiconductor substrate in the channel region thereof defined between said source and drain regions so as to contact either of these regions.

5 Claims, 6 Drawing Figures

AVALANCHE INJECTION TYPE MOS MEMORY

BACKGROUND OF THE INVENTION

This invention relates to improvements in an avalanche injection type MOS memory.

One known avalanche injection type MOS memory is prepared by forming $P^+$ source and drain regions at a proper space on one side of an N type semiconductor substrate and further a floating gate surrounded by an insulation layer between said source and drain regions. Another conventional MOS memory additionally has an external gate mounted on the upper surface of an insulating layer which surrounds a floating gate.

Where, in such MOS memories, there is impressed a proper reverse voltage across the substrate and either of the source and drain regions, for example, the drain region, then there takes place the avalanche breakdown of the P-N junction formed between the semiconductor substrate and the drain region. When electrons resulting from said breakdown are injected into the insulating layer to be trapped by the floating gate, then there occur holes in the upper surface layer of the channel region of the semiconductor substrate defined between the source and drain regions, thereby creating a P channel so as to bring the surface layer between the source and drain regions to a conducting state. This conducting state can be utilized as memory means for storing "1" of binary information. Further, when the surface layer is rendered nonconducting through erasure of electrons trapped in the floating gate, then this nonconducting state can be made available for storage of "0" of binary information.

An MOS memory of the above-mentioned construction is demanded to be impressed with a low storing voltage or write-in voltage, namely, a low avalanche breakdown voltage of the above-mentioned P-N junction. Further, erasure of stored information, that is, elimination of electrons trapped in the floating gate has heretofore been effected by irradiating X-rays or ultraviolet rays on said memory element. However, this process had the drawback that the memory element was subject to damage or said erasure was not fully carried out. Therefore, it is desired that said erasure be effected by electrical means. The reason is that this electrical erasing means prominently facilitates the selective erasure of information stored in the desired one of numerous memory elements.

It is accordingly an object of this invention to provide an avalanche injection type MOS memory which admits of application of low avalanche breakdown voltage in storing information.

Another object of the invention is to provide an avalanche injection type MOS memory which enables not only information to be stored with low avalanche breakdown voltage, but also stored information to be erased by electrical means.

SUMMARY OF THE INVENTION

According to an aspect of this invention, there is provided an avalanche injection type metal oxide semiconductor (MOS) memory which comprises a semiconductor substrate of one conductivity type and an electrode thereof; source and drain regions spatially formed on one side of said semiconductor substrate with the opposite conductivity type to that of said substrate and electrodes thereof; a floating gate formed between said source and drain regions and surrounded by an insulating layer; and at least one auxiliary semiconductor region formed in the channel region of the semiconductor substrate so as to abut against only one of the source and drain regions with the same conductivity type as, but with higher concentrations of impurities than, said semiconductor substrate.

Provision of said auxiliary region effectively reduces avalanche breakdown voltage required to store information. If an avalanche injection type MOS memory has an external gate mounted on the upper surface of the insulating layer which surrounds the floating gate and is additionally provided with said auxiliary region, then said MOS memory permits the easy electrical erasure of stored information by impressing said external gate with voltage of the opposite polarity to that used in the storage of information.

BRIEF DESCRIPTION OF THE DRAWINGS

FIGS. 1A to 2A are plan views showing the relative positions of the source, drain, auxiliary regions, floating gate and external gate electrode formed according to various embodiments of this invention;

DESCRIPTION OF THE PREFERRED EMBODIMENTS

Figure 1A:
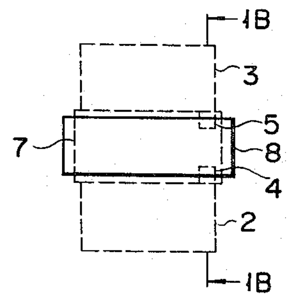
Figure 1B:
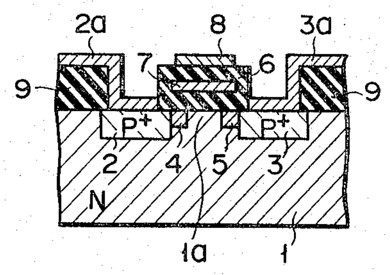
FIG. 1B is a cross sectional view on line 1B—1B of FIG. 1A.

Referring to FIG. 1B, reference numeral 1 represents an N type silicon semiconductor substrate containing impurities at concentration of $5 \times 10^{14}$ $cm^{-3}$. On one side of said substrate are formed source and drain regions 2 and 3, for example, by the known selective diffusion of boron at concentration of $1 \times 10^{20}$ $cm^{-3}$. In a channel region 1*a* between said source and drain regions 2 and 3 are formed by the same diffusion process auxiliary semiconductor regions 4 and 5 with the same conductivity type as, but with higher impurity concentration ($N^+$) of, for example, $1 \times 10^{17}$ $cm^{-3}$ than, the semiconductor substrate 1. Between the source and drain region 2 and 3 is provided a floating gate 7 surrounded by an insulating layer 6 of, for example, $SiO_2$. Further, on the upper surface of the insulating layer 6 is mounted an external gate 8. Numerals 2*a* and 3*a* denote the electrodes of the source and drain regions 2 and 3 respectively. The electrode of the semiconductor substrate is not shown. Numeral 9 shows another insulating layer.

Where there is stored "1" of binary information in an MOS memory of the above-mentioned construction, the electrodes 2*a* and 3*a* of the source and drain regions 2 and 3 are impressed with −15V with the voltage of the semiconductor substrate kept at zero. Then there takes place the avalanche breakdown of P-N junctions formed between the source region 2 and the auxiliary region 4 abutting thereon as well as between the drain region 3 and auxiliary region adjacent thereto with the result that electrons are paired with holes. Where, at this time, the floating gate is impressed with positive voltage, then said voltage creates an electric field so acting as to accelerate electrons. Accordingly, the electrons are injected into the insulating layer to be trapped in the floating gate 7. Said trapped electrons induce positive holes near the surface of the channel region 1a of the semiconductor substrate 1 to form a P channel. As the result, a MOS memory is rendered conducting, namely, is brought to a state ready for the write-in of "1." The auxiliary regions 4 and 5 which are formed by diffusion of an impurity have higher concentrations thereof near the surface. Consequently the aforesaid avalanche breakdown occurs near said surface, facilitating the injection of electrons into the floating gate. Control of impurity concentrations on the auxiliary regions 4 and 5 reduces the avalanche breakdown voltage, that is, the write-in voltage to about −15V. Without said auxiliary regions 4 and 5, there would be required a write-in voltage of about −40V.

Erasure of stored information is effected by impressing, for example, −15V on the source and drain regions 2 and 3 with the substrate 1 kept at zero volts so as to give rise to the avalanche breakdown and also impressing, for example, −100V on the external gate 8. Thus, the positive holes derived from the avalanche breakdown are introduced into the floating gate 8 to recombine with the electrons trapped at the write-in time with the resultant erasure of the latter. Accordingly, an interspace between the source and drain regions 2 and 3 is rendered nonconducting, namely, the stored information is erased.

Figure 2A:
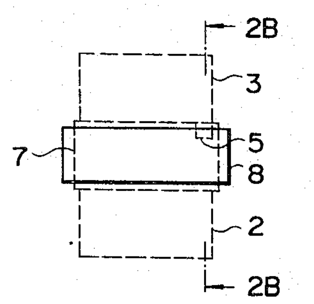
Figure 2B:
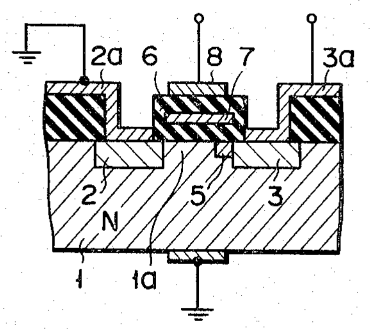
FIG. 2B is a cross sectional view on line 2B—2B of FIG. 2A.
Figure 4A:
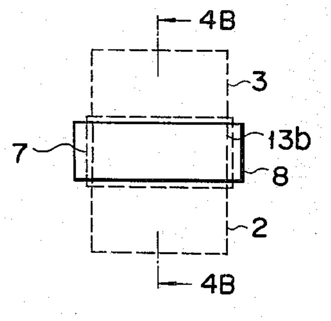
FIG. 4 is a curve diagram showing the manner in which the threshold voltage varies according to the presence or absence of an auxiliary region in the embodiment of FIG. 2B.
Figure 4B:
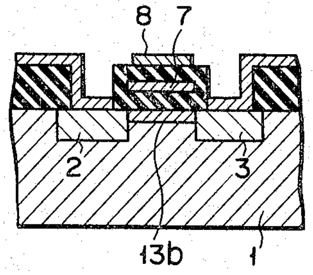

FIG. 2B represents another embodiment where there is formed only one auxiliary semiconductor region 5 in proximity to the drain region 3. The MOS memory of FIG. 2B has the same effect as that of FIG. 1B.

Figure 3A:
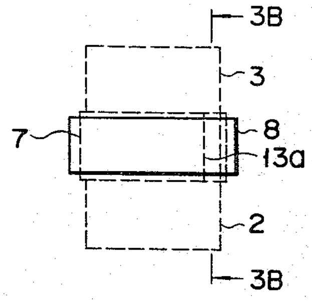
FIG. 3 is a cross sectional view of an avalanche injection type MOS memory having a modified semiconductor substrate according to another embodiment of the invention.
Figure 3B:
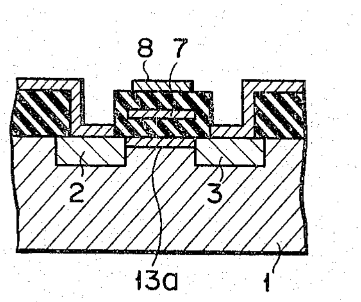
Figure 3:
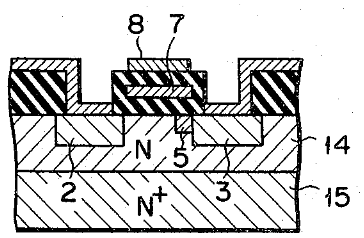
Figure 6:
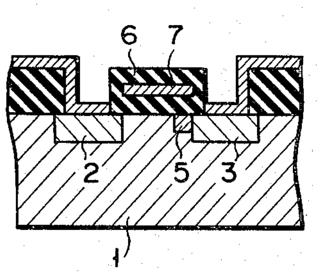
Figure 4:
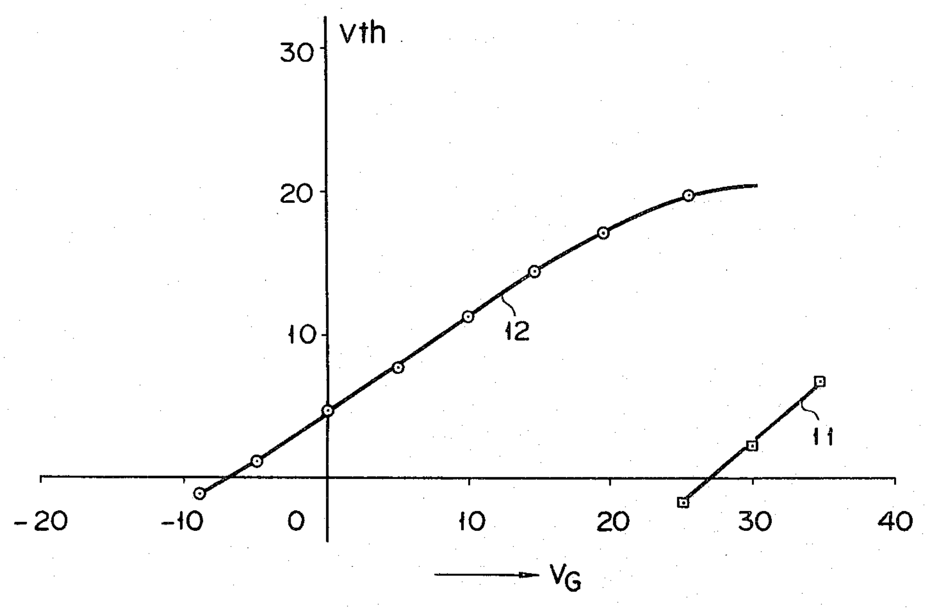

There will now be described by reference to FIG. 4 the results of an experiment which was found to decrease the write-in voltage. Referring to FIG. 2B, the semiconductor substrate 1 has an impurity concentration of $10^{15}$ $cm^{-3}$, the source and drain regions 2 and 3 $10^{20}$ $cm^{-3}$ and the auxiliary region 5 $5 \times 10^{16}$ $cm^{-3}$. Insulating layers 6 between the surface of the substrate channel region 1*a* and the floating gate 7, as well as between said floating gate 7 and the external electrode have thicknesses of 1,600A and 2,000A respectively. There will now be described by reference to FIG. 4 the manner in which the threshold voltage varies where the source electrode 2*a* and semiconductor substrate 1 are grounded, and the drain electrode 3*a* is impressed with a voltage $V_D$ and the external electrode 8 with a voltage $V_G$. In this case the voltage $V_G$ with which current begins to flow across the source and drain regions 2 and 3 may be taken to represent the threshold voltage V*ths*. V*ths* represents the threshold voltage after a write-in operation is completed. A higher value of V*ths* represents larger amounts of electrons written-in or trapped on the floating gate. This means also the current flow from the source to the drain is larger when the external gate is connected to the substrate. In other words, the aforesaid voltage $V_G$ for allowing the passage of current across the source and drain regions 2 and 3 will have a varying value (with the voltage $V_D$ kept unchanged) according to whether there are trapped or not trapped electrons in the floating gate (in the former case, according to the amount of trapped electrons). A high threshold voltage V*th* means that there is trapped a sufficient amount of electrons for the write-in and a low threshold voltage V*th* shows that there is trapped an insufficient amount thereof. Referring to FIG. 4, the voltage $V_{GW}$ is plotted on the abscissa and the threshold voltage Vths on the ordinate. Where the write-in drain voltage is $V_{DW} = -30V$, the curve 11 indicates the characteristics of the threshold voltage Vths in the absence of the auxiliary region 5 and the curve 12 those of said voltage Vths in the presence of the auxiliary region 5. At $V_{DW} = -30V$ and $V_{GW} = 30V$ (applied voltage on the external gate when write-in operation is conducted), the curve 11 indicates a threshold voltage of only 2V and the curve 12 that of about 20V. The former curve shows that little information is stored and the latter indicates that information is fully stored.

Where there are formed, as shown in FIG. 3, two semiconductor substrate layers, that is, a first semiconductor substrate layer 14(N) containing lower concentrations of impurities and a second semiconductor substrate layer 15($N^+$) having the same conductivity as, but higher concentrations of impurities than, said first layer, then there will be obtained a larger amount of avalanche breakdown current for the same write-in voltage with said semiconductor substrate fallen to have a small resistivity.

Where there are integrated a large number of the above-mentioned MOS memory cells, the process of electrically erasing stored information is very useful to carry out said erasure selectively.

There has been described the P channel memory. Obviously, however, this invention is also applicable to an N channel memory and other semiconductors than the silicon type.

What is claimed is:

1. An avalanche injection type metal oxide semiconductor memory comprising:

a semiconductor substrate of one conductivity type and an electrode thereof;

source and drain regions spatially formed on one side of said semiconductor substrate with the opposite conductivity type to that of said semiconductor substrate and electrodes thereof;

a floating gate provided between said source and drain regions, said floating gate being surrounded by an insulating layer;

at least one auxiliary semiconductor region formed in the channel region of said semiconductor substrate so as to abut against only one of said source and drain regions with the same conductivity type as, but with higher concentrations of impurities than, said semiconductor substrate so as not to extend over the whole channel region; and an external electrode impressed with voltage of different polarities at the time of write-in and erasure.

2. The metal oxide semiconductor memory according to claim 1 wherein there is formed one auxiliary region so as to abut against at least one of the source and drain regions.

3. The metal oxide semiconductor memory according to claim 1 wherein there are formed two auxiliary regions so as to abut against the source and drain regions respectively.

4. The metal oxide semiconductor memory according to claim 1 wherein the semiconductor substrate comprises two layers of the same conductivity type, a first layer having lower concentrations of impurities than a second one; and the source, drain and auxiliary regions are formed on the first semiconductor layer.

5. The metal oxide semiconductor memory according to claim 1 wherein the semiconductor substrate comprises two semiconductor layers of the same conductivity type, a first layer having lower concentrations of impurities than a second one; and the source, drain and auxiliary regions are formed on the first semiconductor layer.

* * * * *

UNITED STATES PATENT OFFICE
CERTIFICATE OF CORRECTION

PATENT NO. : 3,868,187
DATED : February 25, 1975
INVENTOR(S) : Fujio MASUOKA

It is certified that error appears in the above-identified patent and that said Letters Patent are hereby corrected as shown below:

Add the following priority data:

--Foreign Application Priority Data

September 16, 1971 Japan.............71222/71--.

Signed and sealed this 6th day of May 1975.

(SEAL)
Attest:

RUTH C. MASON
Attesting Officer

C. MARSHALL DANN
Commissioner of Patents
and Trademarks